United States Patent
Jow et al.

(10) Patent No.: US 7,515,435 B2
(45) Date of Patent: Apr. 7, 2009

(54) MULTI-FUNCTIONAL COMPOSITE SUBSTRATE STRUCTURE

(75) Inventors: Uei-Ming Jow, Hsinchu (TW);
Chang-Sheng Chen, Hsinchu (TW);
Chin-Sun Shyu, Hsinchu (TW);
Min-Lin Lee, Hsinchu (TW);
Shinn-Juh Lay, Hsinchu (TW);
Ying-Jiunn Lai, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/646,339

(22) Filed: Dec. 28, 2006

(65) Prior Publication Data
US 2007/0164396 A1    Jul. 19, 2007

(30) Foreign Application Priority Data
Jan. 13, 2006  (TW) .............................. 95101511 A

(51) Int. Cl.
*H05K 1/16* (2006.01)

(52) U.S. Cl. .................. 361/766; 361/312; 361/313; 361/760; 361/761; 361/762; 361/763; 174/250; 174/255; 174/256; 174/258; 174/260

(58) Field of Classification Search .......... 361/12–313, 361/760–766; 174/250–260
See application file for complete search history.

(56) References Cited

U.S. PATENT DOCUMENTS

| | | | | |
|---|---|---|---|---|
| 4,661,193 A | * | 4/1987 | Kirchhoff et al. | ........ 156/307.3 |
| 4,882,650 A | | 11/1989 | Maher et al. | |
| 4,981,394 A | * | 1/1991 | McLaren et al. | .............. 588/17 |
| 5,155,655 A | | 10/1992 | Howard et al. | |
| 5,172,304 A | * | 12/1992 | Ozawa et al. | ............... 361/763 |
| 5,392,020 A | | 2/1995 | Chang | |
| 5,537,036 A | * | 7/1996 | Sato et al. | .................... 324/239 |
| 5,753,968 A | * | 5/1998 | Bahl et al. | ................... 257/664 |
| 5,932,345 A | * | 8/1999 | Furutani et al. | ............. 428/364 |
| 6,018,421 A | | 1/2000 | Cushing et al. | |
| 6,083,619 A | * | 7/2000 | Frank et al. | ................. 428/331 |
| 6,091,025 A | * | 7/2000 | Cotter et al. | ............ 174/110 R |
| 6,429,763 B1 | | 8/2002 | Patel et al. | |
| 6,480,086 B1 | * | 11/2002 | Kluge et al. | ................. 336/200 |
| 6,628,242 B1 | * | 9/2003 | Hacker et al. | ................ 343/909 |
| 6,818,469 B2 | * | 11/2004 | Mori et al. | ..................... 438/52 |
| 7,174,024 B1 | * | 2/2007 | Suzuki et al. | ................ 381/152 |

(Continued)

FOREIGN PATENT DOCUMENTS

CN    1299229    6/2001

*Primary Examiner*—Dean A. Reichard
*Assistant Examiner*—Xiaoliang Chen
(74) *Attorney, Agent, or Firm*—Rabin & Berdo, P.C.

(57) ABSTRACT

A multi-functional composite substrate structure is provided. The first substrate with high dielectric constant and the second substrate with low dielectric constant and low loss tangent are interlaced above the third substrate. One or more permeance blocks may be formed above each substrate, so that one or more inductors may be fabricated thereon. One or more capacitors may be fabricated on the first substrate. Also, one or more signal transmission traces of the system impedance are formed on the second substrate of the outside layer. Therefore, the inductance of the inductor(s) is effectively enhanced. Moreover, the area of built-in components is reduced. Furthermore, it has shorter delay time, smaller dielectric loss, and better return loss for the transmission of high speed and high frequency signal.

21 Claims, 19 Drawing Sheets

U.S. PATENT DOCUMENTS

| | | | |
|---|---|---|---|
| 7,196,906 B1 * | 3/2007 | Alexander et al. | 361/760 |
| 7,349,196 B2 * | 3/2008 | Chang et al. | 361/321.4 |
| 2002/0140539 A1 * | 10/2002 | Takashima et al. | 336/200 |
| 2002/0159242 A1 * | 10/2002 | Nakatani et al. | 361/760 |
| 2002/0167457 A1 * | 11/2002 | McKinzie et al. | 343/909 |
| 2002/0179329 A1 * | 12/2002 | Fukuoka et al. | 174/260 |
| 2002/0184426 A1 * | 12/2002 | Otsuka et al. | 710/305 |
| 2002/0195270 A1 * | 12/2002 | Okubora et al. | 174/260 |
| 2003/0052765 A1 * | 3/2003 | Kanetaka et al. | 336/200 |
| 2003/0107465 A1 * | 6/2003 | Hiraoka et al. | 338/13 |
| 2003/0112186 A1 * | 6/2003 | Sanchez et al. | 343/700 MS |
| 2004/0013924 A1 * | 1/2004 | Park et al. | 429/33 |
| 2004/0028875 A1 * | 2/2004 | Van Rijn et al. | 428/98 |
| 2004/0040740 A1 * | 3/2004 | Nakatani et al. | 174/256 |
| 2004/0235498 A1 * | 11/2004 | Vu et al. | 455/456.1 |
| 2005/0003199 A1 * | 1/2005 | Takaya et al. | 428/413 |
| 2005/0025582 A1 * | 2/2005 | Ianniello | 405/302.4 |
| 2005/0032989 A1 * | 2/2005 | Onai et al. | 525/477 |
| 2005/0081349 A1 * | 4/2005 | Chang | 29/25.03 |
| 2005/0183740 A1 * | 8/2005 | Fulton et al. | 134/3 |
| 2005/0183883 A1 * | 8/2005 | Bois et al. | 174/255 |
| 2005/0218524 A1 * | 10/2005 | Japp et al. | 257/762 |
| 2005/0224251 A1 * | 10/2005 | Memis et al. | 174/255 |
| 2005/0230619 A1 * | 10/2005 | Talanov et al. | 250/310 |
| 2005/0258522 A1 * | 11/2005 | En et al. | 257/670 |
| 2006/0013759 A1 * | 1/2006 | Jiang et al. | 423/648.1 |
| 2006/0044734 A1 * | 3/2006 | Ahn et al. | 361/313 |
| 2006/0151202 A1 * | 7/2006 | Das et al. | 174/256 |
| 2006/0182941 A1 * | 8/2006 | Yano et al. | 428/292.1 |
| 2006/0285273 A1 * | 12/2006 | Chang et al. | 361/312 |

* cited by examiner

MULTI-FUNCTIONAL COMPOSITE SUBSTRATE STRUCTURE

CROSS-REFERENCE TO RELATED APPLICATIONS

This non-provisional application claims priority under 35 U.S.C. § 119(a) on Patent Application No(s). 095101511 filed in Taiwan, R.O.C. on Jan. 13, 2006, the entire contents of which are hereby incorporated by reference.

BACKGROUND OF THE INVENTION

1. Field of Invention

The present invention relates to a multi-functional composite substrate structure, and more particularly, to a multi-functional composite substrate structure adapted for fabricating various built-in passive components.

2. Related Art

With the trend towards high function and high speed of electronic products, various passive components, such as resistors, capacitors, and inductors, have to be integrated on a semiconductor package, so as to enhance or stabilize the electrical functionality of electronic products.

Conventionally, passive components are disposed on the surface of the substrate of a printed circuit board (PCB) or semiconductor chip. However, to satisfy the trend towards high functionality and miniaturization of electronic products, the lamination technique of the circuit board must have advantages such as thinness, multi-layer, and high density. Therefore, to create larger space and improve the multi-functionality of the module in a limited substrate area, the circuit layout and the distance of signal transmission are usually reduced by reducing the area of the passive components or building them inside, thereby creating more space to build active components and improve the performance of the overall components. Therefore, the substrate structure of built-in passive components such as resistors, capacitors, and inductors is provided.

Through building resistors, capacitors, and inductors inside, various components are formed on the circuit substrate during the fabrication of the substrate, so as to enhance the stability of the circuit fabrication, reduce the number of welding spots and the number of passive components on the substrate, and improve the reliability of the fabrication. Moreover, the area of the substrate can be reduced for reducing the fabricating cost of the circuit, thereby conform to the requirements for fabricating substrates in future electronic products. The substrate architecture of conventional built-in components only concentrates on one component or a specific function, thus greatly limiting the application of built-in components for the substrate. However, to optimize the electrical features of various components, it is insufficient to employ only one kind of substrate material. Most conventional arts directed to materials of high dielectric coefficient, so only relative components such as built-in capacitors are designed. In the thick film ceramic process, a substrate structure design integrated with various materials is used, in which different materials can be filled in different areas to fit different components. However, when different materials are used for different blocks, the fabricating cost is increased, the design is complicated, and the process is inaccurate.

Please refer to FIG. 1, a conductive metal sheet 110, a dielectric thin plate 120, and a conductive metal sheet 112 are stacked sequentially to form a capacitive substrate structure 100, as shown in U.S. Pat. No. 5,155,655. The lamination structure can only provide the substrate structure with the capacitive circuit function. Moreover, when the dielectric thin plate 120 is made of high dielectric coefficient materials, there is difficulty in wiring. Besides, when the outside plate has no particular design to increase the electrical property of the transmission line, the lamination structure cannot widely and effectively improve the performance of the substrate.

Referring to FIG. 2, it is a substrate structure made of two special materials. The two special substrate materials are sintered to form a substrate structure 200 formed by interlacely stacking substrates 210, 212, 214 of low dielectric loss and low dielectric constant and substrates 220, 222 of high dielectric constant. The substrate structure 200 can be used to fabricate built-in capacitors and circuits of low dielectric loss, as shown in U.S. Pat. No. 4,882,650. Though many functions of the substrate are added and significantly improved, large inductors of high price still cannot be built inside, while only wires are wound.

In U.S. Pat. No. 6,429,763, magnetic substances are used as substrates and provide the inductive circuit function by winding wires. However, only the inductivity is taken into consideration, while the coupling parasitic effect between other components and the inductor are neglected. Therefore, there is no effective integrated solution directing to the materials of built-in components and the transmission line. Moreover, as the whole substrate uses a magnetic substance, the magnetic field generated cannot be effectively shielded.

As such, most of the substrate structures at present are provided to build specific components inside. Therefore, in order to improve the design and application of various built-in components, it is a trend for those skilled in the art to provide a desired multi-functional substrate structure.

SUMMARY OF THE INVENTION

In view of the above, a main object of the invention is to provide a multi-functional composite substrate structure to solve the problem in the prior art of considering only one component or a certain function.

Therefore, in order to achieve the above purpose, the multi-functional composite substrate structure disclosed by the present invention includes a first substrate, a second substrate adjacent to the first substrate, and a permeance block disposed on the surface of the second substrate, wherein the dielectric constant of the first substrate is higher than that of the second substrate.

According to another preferred embodiment of the present invention, the multi-functional composite substrate structure includes a first substrate, a second substrate adjacent to the first substrate, and a third substrate adjacent to the side opposite to the side of the first adjacent to the second substrate. The dielectric constant of the first substrate is higher than that of the third substrate, the dielectric constant of the second substrate is lower than that of the third substrate, and the dielectric loss of the second substrate is lower than that of the third substrate.

According to still another preferred embodiment of the present invention, the multi-functional composite substrate structure includes a first substrate, a second substrate adjacent to the first substrate, and a signal transmission circuit disposed at the opposite side of the side of the first adjacent to the second substrate. The dielectric constant of the first substrate is higher than that of the second substrate.

In comparison with the prior art, the present invention can effectively reduce the circuit layout and the distance of the signal transmission, and effectively reduce the area of various passive components or build them inside, so as to create more space to build active components and improve the performance of the whole components.

The features and practice of the preferred embodiments of the present invention will be illustrated in detail below with the accompanying drawings.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and which thus is not limitative of the present invention, and wherein.

DETAILED DESCRIPTION OF THE INVENTION

Figure 1:
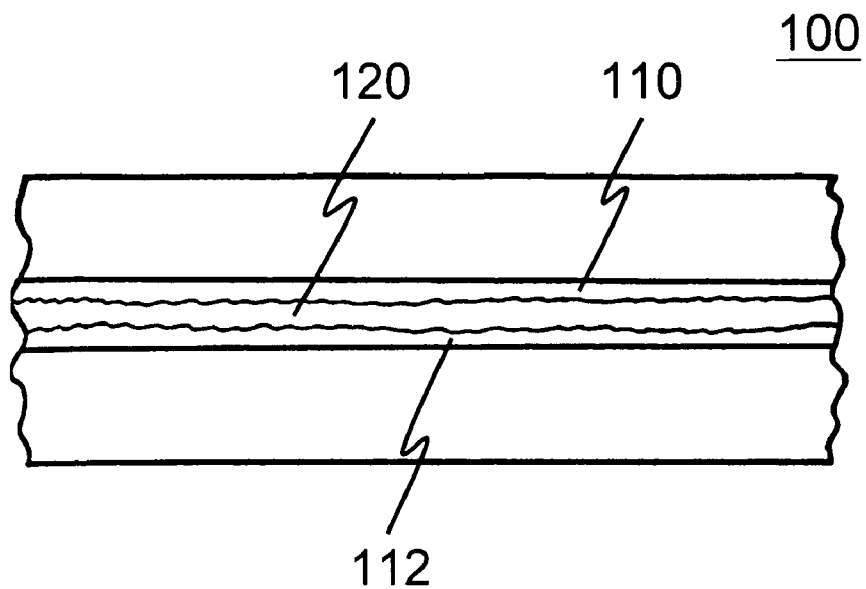
FIG. 1 is a sectional view of a conventional substrate structure.
Figure 2:
FIG. 2 is a sectional view of another conventional substrate structure.

The embodiments are described to illustrate the content of the present invention in detail with reference to the drawings. The symbols mentioned in the illustration refer to corresponding symbols in the drawings.

Figure 3:
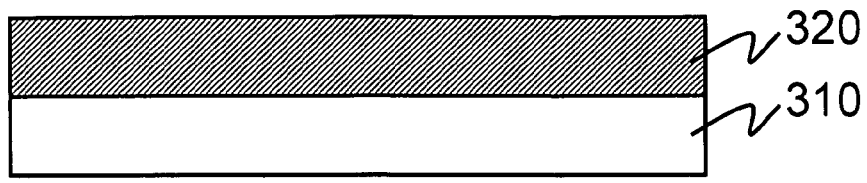
FIG. 3 is a sectional view of the multi-functional composite substrate structure according to the invention.

Please refer to FIG. 3 of a multi-functional composite substrate structure according to one embodiment of the invention. The multi-functional composite substrate structure can be used to build in various passive components. The substrate structure is formed by laminating a first substrate 310 and a second substrate 320, wherein the dielectric constant of the first substrate 310 is higher than that of the second substrate 320.

The second substrate 320 is made of glass fiber or materials of low dielectric constant, so the first substrate 310 can be made of materials of high dielectric constant relative to the glass fiber or materials of high dielectric constant relative to materials of low dielectric constant. Besides, the dielectric loss of the second substrate is lower than that of the first substrate, which is the second substrate can be made of materials of low dielectric constant and low dielectric loss.

Further, the material of high dielectric constant has a dielectric constant higher than 4, while the material of low dielectric constant has a dielectric constant lower than 4. The material of low dielectric loss has a dielectric loss lower than 0.03.

As such, the built-in capacitors 350 can be fabricated in the first substrate 310, while the signal transmission circuit 340 can be disposed on the second substrate.

Figure 4:
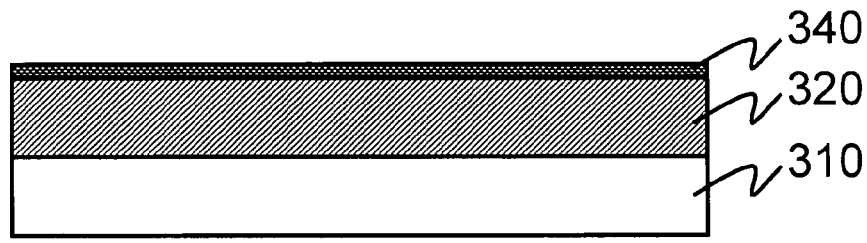
FIG. 4 is a sectional view of the multi-functional composite substrate structure according to the invention.

As shown in FIG. 4, a signal transmission circuit 340 is disposed on the surface of the second substrate 320 and not adjacent to the first substrate 310. The signal transmission circuit has specific system impedances, such as 50, 75, or 28.5 Ohm. As such, interference and impedance mismatch caused by signal delay and structural discontinuity of the signal transmission circuit 340 can be avoided, for example, a signal transmission circuit through a via or non-system impedance.

Figure 5:
FIG. 5 is a sectional view of the multi-functional composite substrate structure according to the invention.

Moreover, the first substrate 310 can be used to fabricate capacitors. As shown in FIG. 5, two metal plates 352, 354 coupled to each other and respectively disposed on both surfaces of the first substrate 310 to form a built-in capacitor 350.

Figure 6A:
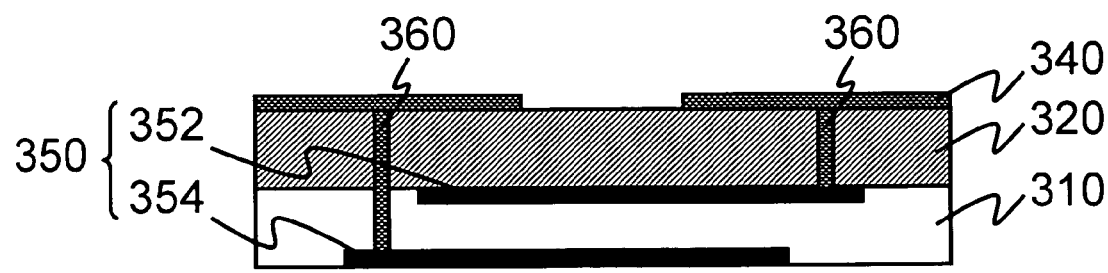
FIG. 6A is a sectional view of the multi-functional composite substrate structure according to the invention.

Each of the metal plates 352, 354 can be electrically connected to the signal transmission circuit 340 on the second substrate 320 respectively through a via 360 penetrating the substrate, as shown in FIG. 6A. The via 360 can be in the form of a wire, through hole, or blind hole. It can penetrate the substrate in a manner either perpendicular to the surface of the substrate or not perpendicular thereto. Therefore, various different capacitances of capacitors can be formed by controlling the coupling area of the metal plates, adjusting the dielectric constant of the first substrate 310, or adjusting the thickness of the first substrate 310. As the capacitor is formed on the first substrate 310, and the first substrate 310 close adjacent to the second substrate 320, the via 360 required for pulling the capacitor out to the signal transmission circuit 340 at the outside layer does not need to be very long, so as to prevent the parasitic inductance being increased by the inductance effect of the via 360, thereby avoiding affecting the working efficiency. Besides, in the design of the PCB, most of the components are capacitors, so it requires plenty of area for making the built-in capacitors 350. Therefore, the design of a whole layer of high dielectric constant material can be adopted to provide more area. As such, a plenty of area can be provided for fabricating built-in capacitors 350, so as to effectively utilize the space, thereby reducing the area of the substrate and reducing the fabricating cost of the circuit.

Figure 6B:
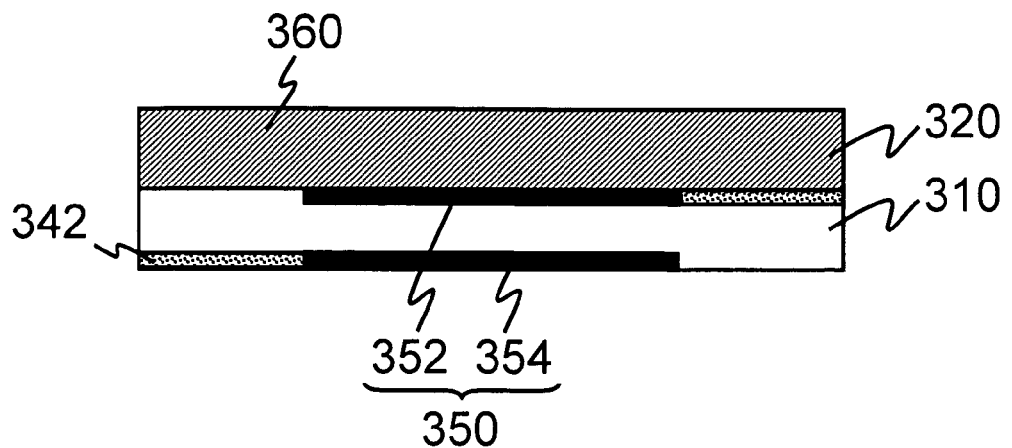
FIG. 6B is a sectional view of the multi-functional composite substrate structure according to the invention.
Figure 6C:
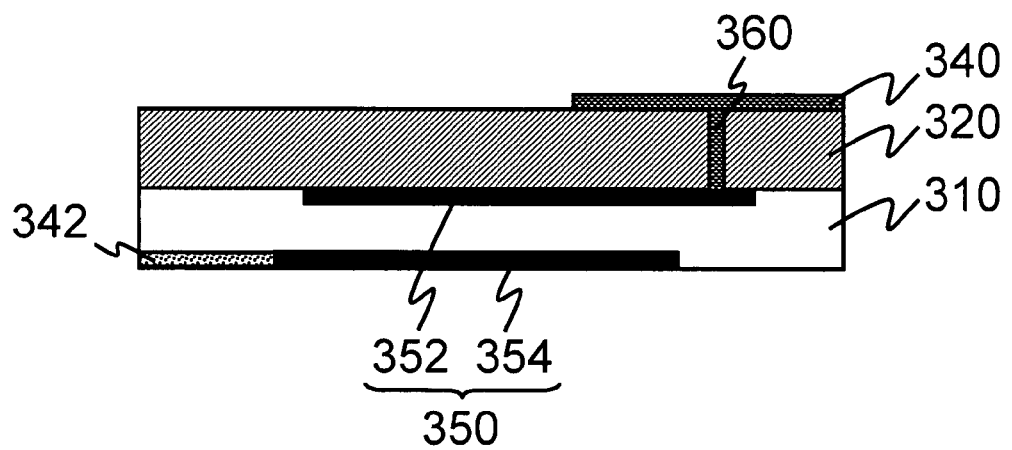
FIG. 6C is a sectional view of the multi-functional composite substrate structure according to the invention.

Moreover, each of the metal plates 352, 354 can be respectively electrically connected to the metal wire 342 on the same surface for transmitting signals, as shown in FIG. 6B. Or, only one metal plate 354 is electrically connected to the metal wire 342 on the same surface, while the other metal plate 352 is electrically connected to the signal transmission circuit 340 on the second substrate 320 through the via 360 penetrating the substrate, as shown in FIG. 6C. The via 360 can be in the form of a wire, through hole, or blind hole, and it can penetrate the substrate in a manner either perpendicular to the surface of the substrate or not perpendicular thereto.

Figure 7A:
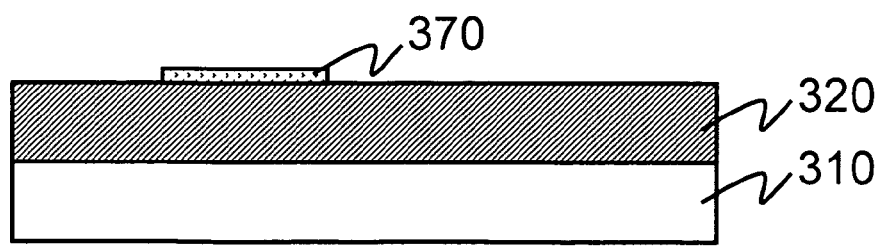
FIG. 7A is a sectional view of the multi-functional composite substrate structure according to the invention.
Figure 7B:
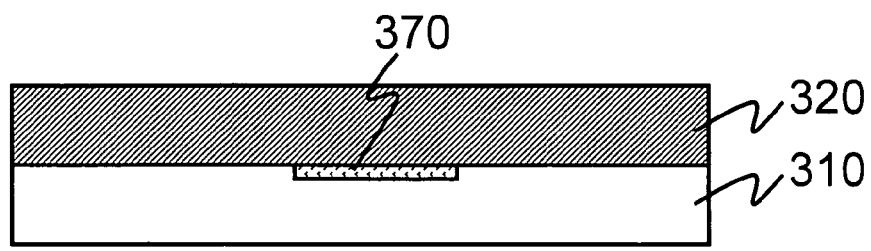
FIG. 7B is a sectional view of the multi-functional composite substrate structure according to the invention.
Figure 8A:
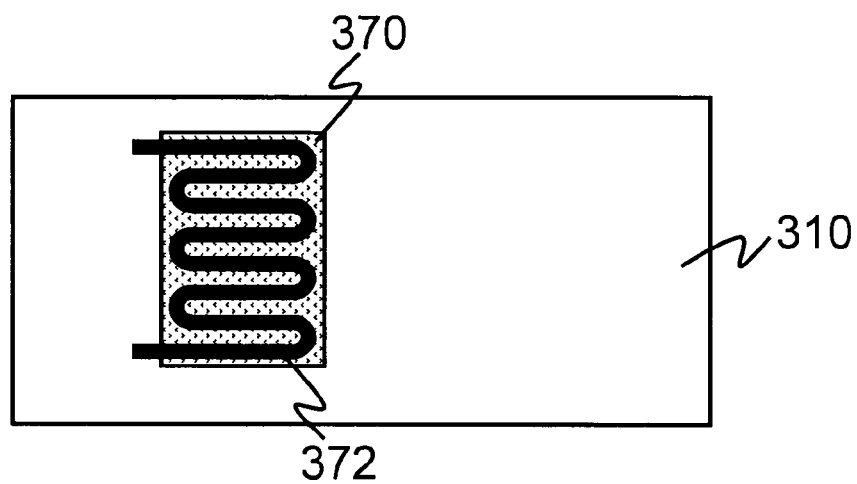
FIG. 8A is a top view of the multi-functional composite substrate structure according to the invention.
Figure 8B:
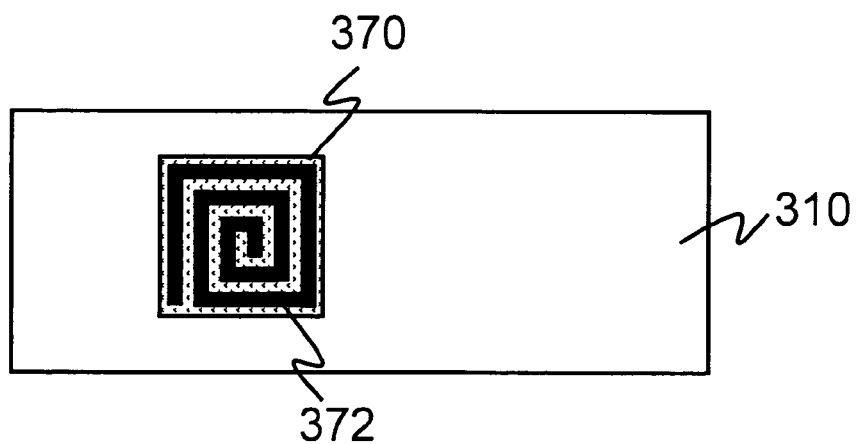
FIG. 8B is a top view of the multi-functional composite substrate structure according to the invention.
Figure 8C:
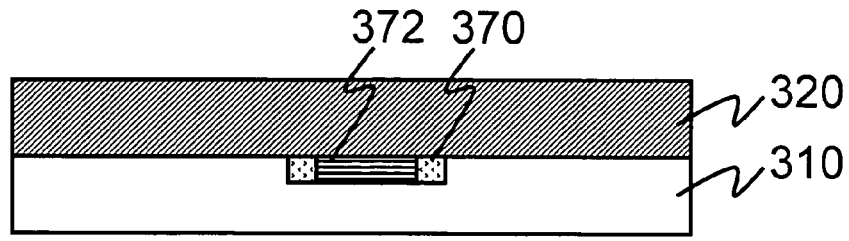
FIG. 8C is a top view of the multi-functional composite substrate structure according to the invention.

Please refer to FIGS. 7A and 7B, magnetic materials can be coated on the surface of the second substrate 320 to form a permeance block 370. By fabricating an inductor on the permeance block 370, the inductance of the inductor can be effectively increased by the permeance block 370, and the second substrate 320 of low dielectric loss can be used to reduce the conductor loss. The inductor 372 can be made by winding wires or wiring on the second substrate 320 and then coating magnetic materials thereon on the permeance block 370. The inductor 372 can be a spiral inductor (as shown in FIG. 8A), meander inductor (as shown in FIG. 8B), or solenoid inductor (as shown in FIG. 8C) and so on. When the inductor 372 is a planar inductor (such as spiral inductor, or meander inductor), the shape of the inductive conductor loop formed by winding wires is similar to or equal to the shape of the permeance block.

Figure 9A:
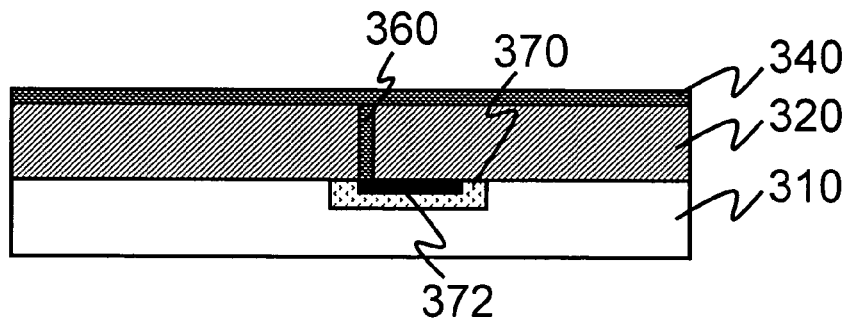
FIG. 9A is a sectional view of the multi-functional composite substrate structure according to the invention.
Figure 9B:
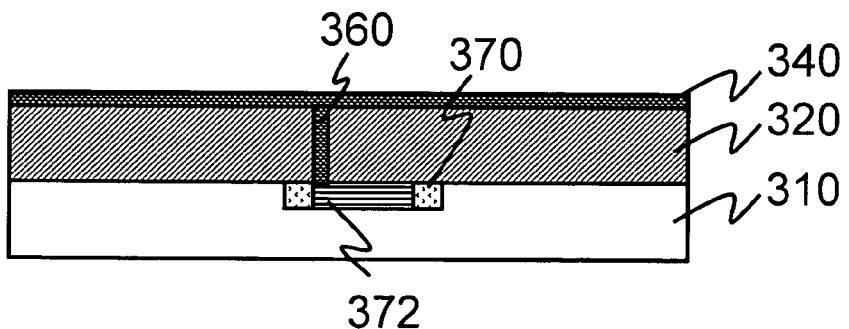
FIG. 9B is a sectional view of the multi-functional composite substrate structure according to the invention.

The inductor 372 between layers, that is a built-in inductor, can be electrically connected to the signal transmission circuit 340 on the second substrate 320 through the via 360 penetrating the substrate, as shown in FIGS. 9A and 9B. The via 360 can be in the form of a wire, through hole, or blind hole, and it can penetrate the substrate in a manner either perpendicular to the surface of the substrate or not perpendicular thereto.

Figure 9C:
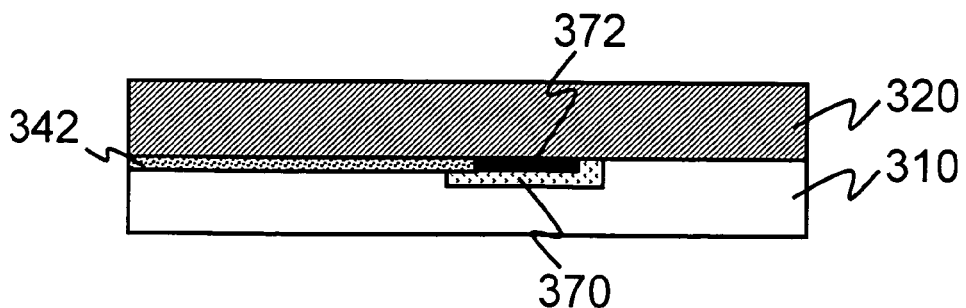
FIG. 9C is a sectional view of the multi-functional composite substrate structure according to the invention.
Figure 9D:
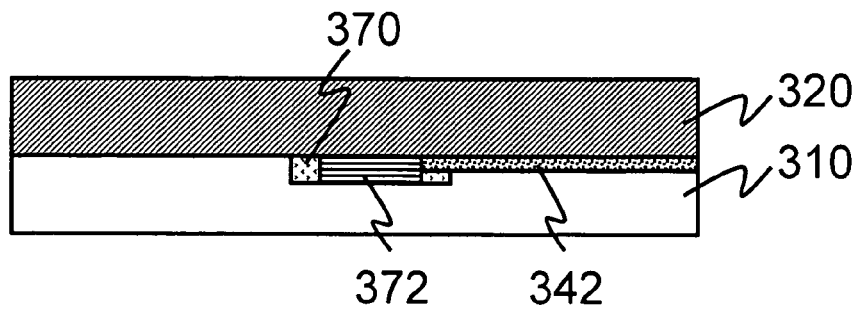
FIG. 9D is a sectional view of the multi-functional composite substrate structure according to the invention.

Moreover, the inductor 372 can also be electrically connected to the metal wire 342 on the same surface respectively for transmitting signals, as shown in FIGS. 9C and 9D.

Figure 10A:
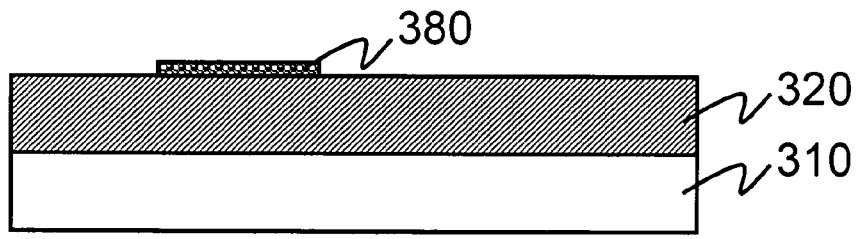
FIG. 10A is a sectional view of the multi-functional composite substrate structure according to the invention.
Figure 10B:
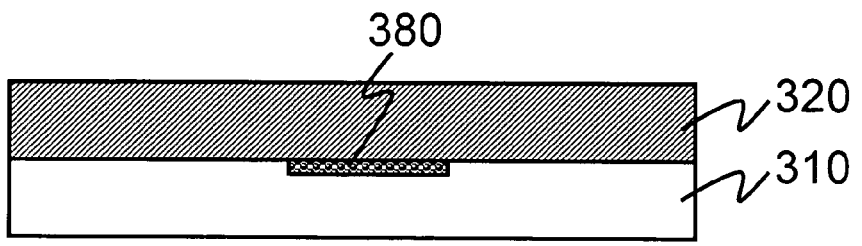
FIG. 10B is a sectional view of the multi-functional composite substrate structure according to the invention.

Referring to FIGS. 10A and 10B, impedance materials can be directly coated on the surface of the second substrate 320 to form a resistor 380, so as to reduce the area of the resistor 380 or build it inside, thereby reducing the circuit layout and the distance of signal transmission for creating more space to build active components and enhance the overall component performance.

Figure 10C:
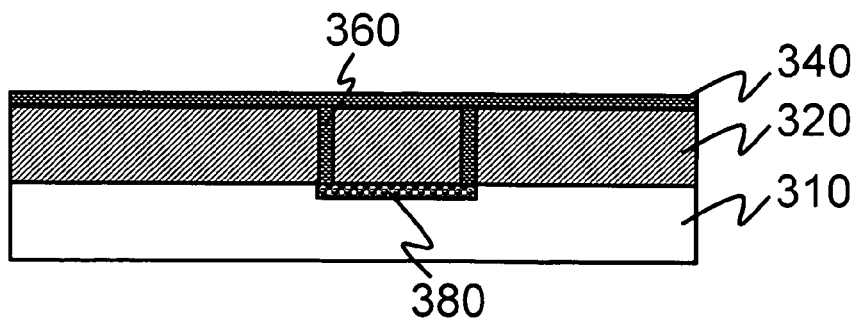
FIG. 10C is a sectional view of the multi-functional composite substrate structure according to the invention.

The inductor 380 between layers, that is a built-in inductor, can be electrically connected to the signal transmission circuit 340 on the second substrate 320 through the via 360 penetrating the substrate, as shown in FIG. 10C. The via 360 can be in the form of a wire, through hole, or blind hole, and it can penetrate the substrate in a manner either perpendicular to the surface of the substrate or not perpendicular thereto.

Figure 10D:
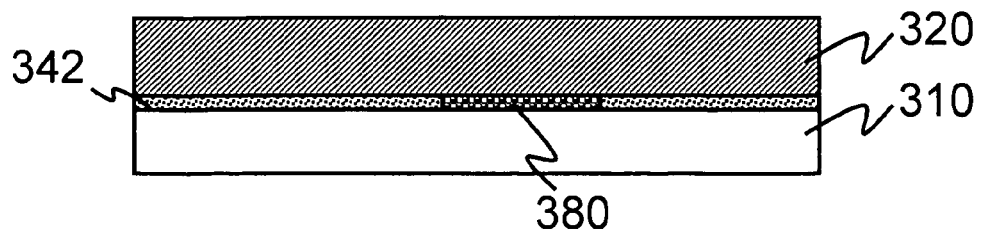
FIG. 10D is a sectional view of the multi-functional composite substrate structure according to the invention.
Figure 10E:
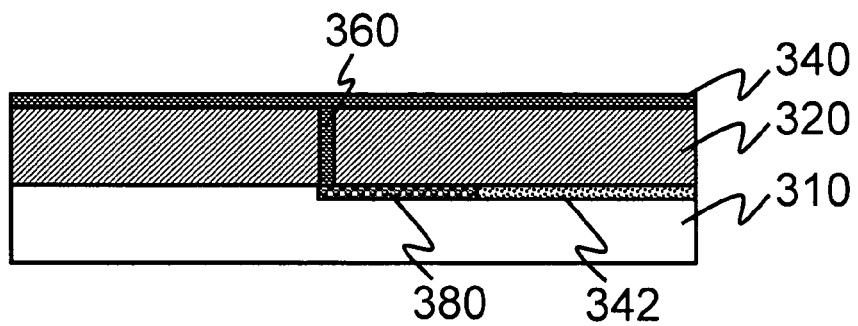
FIG. 10E is a sectional view of the multi-functional composite substrate structure according to the invention.

Further, the resistor 380 can also be electrically connected to the metal wire 342 on the same surface respectively for transmitting signals, as shown in FIG. 10D. Or, one end of the resistor 380 is electrically connected to the metal wire 342 on the same surface, while the other end of the resistor 380 is electrically connected to the signal transmission circuit 340 on the second substrate 320 through the via 360 penetrating the substrate, as shown in FIG. 10E. The via 360 can be in the form of a wire, through hole, or blind hole, and it can penetrate the substrate in a manner either perpendicular to the surface of the substrate or not perpendicular thereto.

Moreover, when the first substrate 310 is made of materials of low dielectric loss, components such as the signal transmission circuit 340, inductor 372, and resistor 380 can also be disposed on the first substrate 310 by the foregoing manner.

Seen from the above, though only one or two kinds of components are fabricated in the multi-functional composite substrate structure provided by the present invention, in fact, the multi-functional composite substrate structure of the present invention can have at least one of the passive components (such as resistors 380, capacitors 350, and inductors 372) and the signal transmission circuit 340. Moreover, each component can be singular or in multiple. That is to say, according to the random combination of the above structures, the formed multi-functional composite substrate structure of the present invention can have at least one of the passive components (such as resistors 380, capacitors 350, and inductors 372) and the signal transmission circuit 340, wherein each component can be singular or in multiple.

Figure 11:
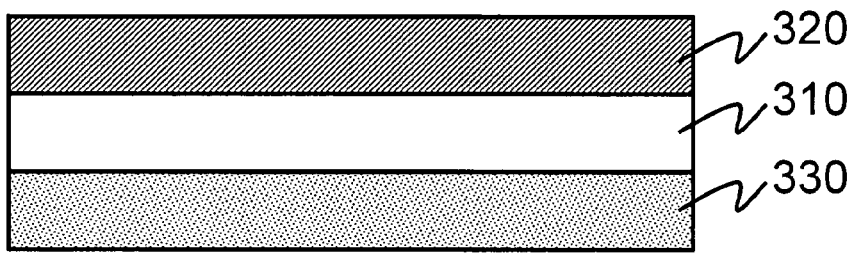
FIG. 11 is a sectional view of the multi-functional composite substrate structure according to the invention.

Furthermore, a third substrate 330 can be disposed on the other surface of the first substrate 310, that is the surface not adjacent to the second substrate 320, so as to enhance the strength of the whole structure, as shown in FIG. 11. In other words, the first substrate 310, second substrate 320, and third substrate 330 are stacked sequentially. The third substrate 330 can be an ordinary PCB (for example, a glass fiber substrate, ceramic substrate, or film substrate etc. such as FR4 or FR5 substrate). The dielectric constant of the first substrate 310 is higher than that of the third substrate 330, while the dielectric constant of the second substrate 320 is lower than that of the third substrate 330.

Besides, the loss tangent of the second substrate can be lower than that of the third substrate.

Figure 12A:
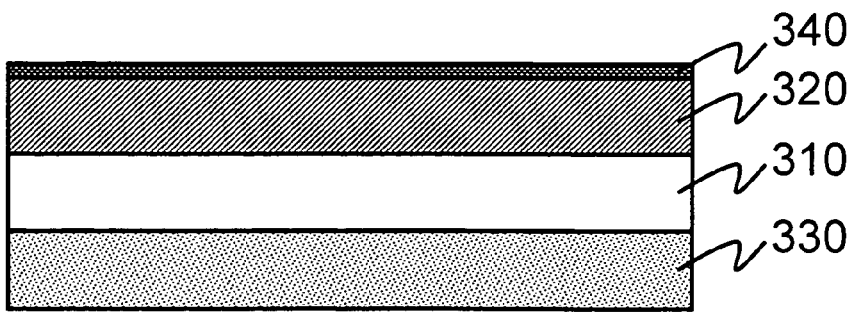
FIG. 12A is a sectional view of the multi-functional composite substrate structure according to the invention.
Figure 12B:
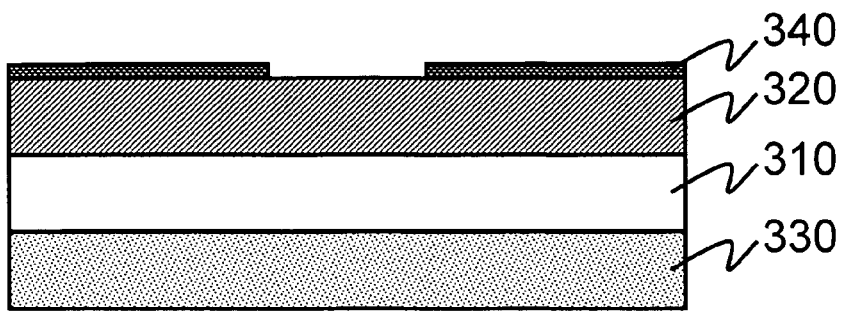
FIG. 12B is a sectional view of the multi-functional composite substrate structure according to the invention.
Figure 12C:
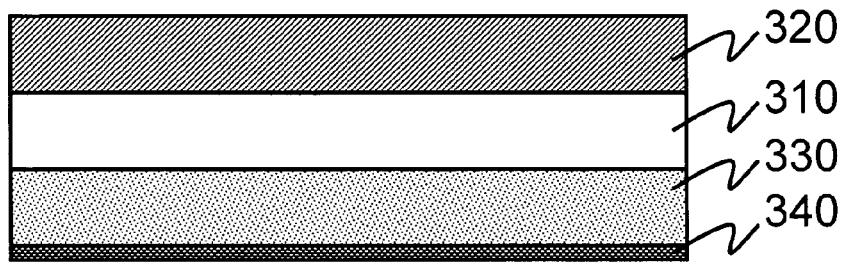
FIG. 12C is a sectional view of the multi-functional composite substrate structure according to the invention.
Figure 12D:
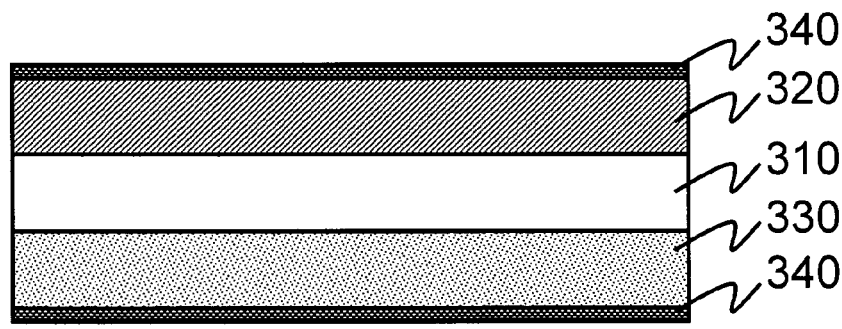
FIG. 12D is a sectional view of the multi-functional composite substrate structure according to the invention.

Now referring to FIGS. 12A, 12B, and 12C, the signal transmission circuit 340 can be disposed on the surface of the second substrate 320/the third substrate 330 not adjacent to the first substrate 310. In other words, one surface of the second substrate 320 is adjacent to the first substrate 310, while the other surface of the second substrate 320 has the signal transmission circuit 340 disposed thereon, as shown in FIGS. 12A and 12B. Moreover, one surface of the third substrate 330 is adjacent to the first substrate 310, while the other surface of the third substrate 330 has the signal transmission circuit 340 disposed thereon, as shown in FIGS. 12C and 12D. The signal transmission circuit 340 can have particular system impedances, such as 50, 75, or 28.5 Ohm. As such, interference and impedance mismatch caused by signal delay and structural discontinuity of the signal transmission circuit 340 can be avoided, such as a signal transmission circuit 340 through a via or non-system impedance.

Figure 13:
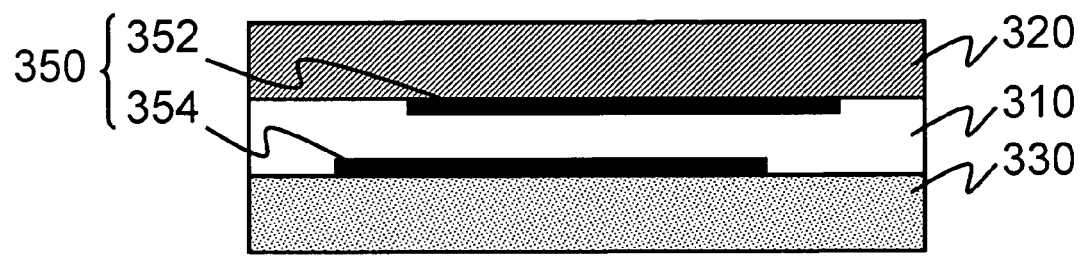
FIG. 13 is a sectional view of the multi-functional composite substrate structure according to the invention.
Figure 14A:
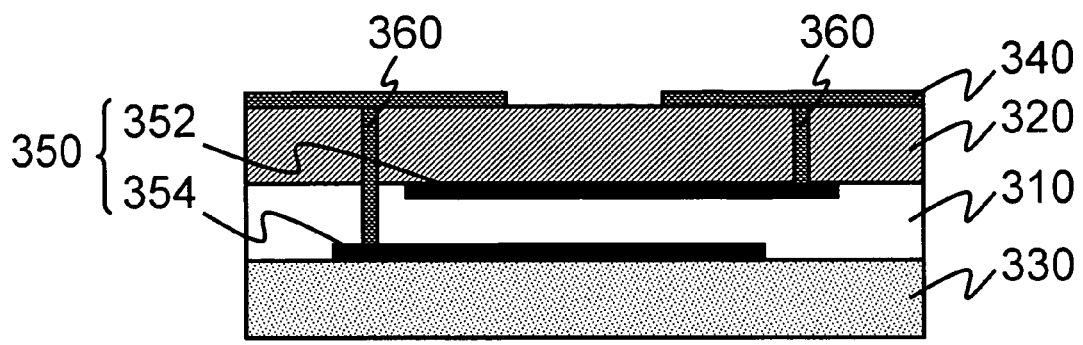
FIG. 14A is a sectional view of the multi-functional composite substrate structure according to the invention.
Figure 14B:
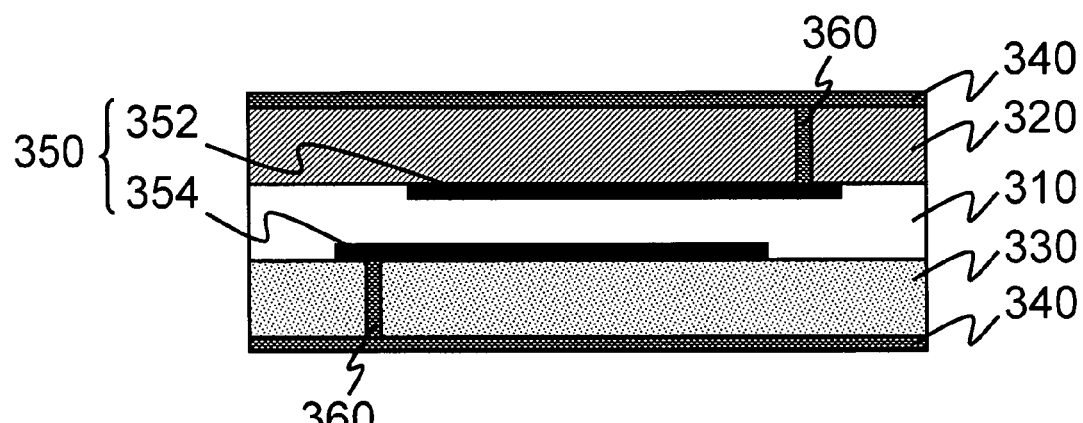
FIG. 14B is a sectional view of the multi-functional composite substrate structure according to the invention.

Two metal plates 352, 354 coupled to each other are disposed at both sides of the first substrate 310 for providing the capacitive circuit function that is forming a built-in capacitor 350, as shown in FIG. 13. The metal plates 352, 354 can be electrically connected to the signal transmission circuit 340 through the via 360 penetrating the substrate, as shown in FIGS. 14A and 14B. The via 360 can be in the form of a wire, through hole, or blind hole. It can penetrate the substrate in a manner either perpendicular to the surface of the substrate or not perpendicular thereto. Therefore, various capacitors of different capacitances can be formed by controlling the coupling area of the metal plate, adjusting the dielectric constant of the first substrate 310, or adjusting the thickness of the first substrate 310. As the capacitor is formed on the first substrate 310 close adjacent to the second 320 substrate and the third substrate 330, the via 360 required for drawing the capacitor out to the signal transmission circuit 340 at the outside layer does not need to be very long, so as to prevent the parasitic inductance being increased by the inductive effect of the via 360, thereby avoiding affecting the working efficiency. Besides, in the design of the PCB, most of the components are capacitors, so it requires plenty of area for making the built-in capacitors 350. Therefore, the design of a whole layer of high dielectric constant material can be adopted to provide more area.

Figure 14C:
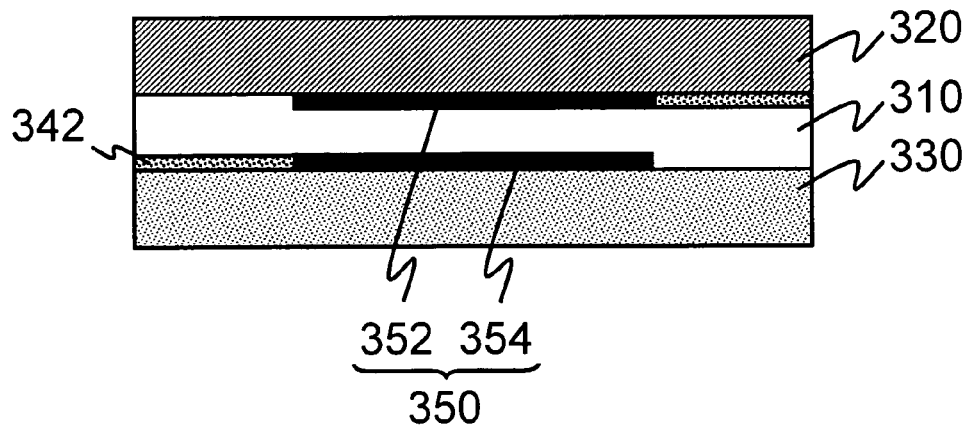
FIG. 14C is a sectional view of the multi-functional composite substrate structure according to the invention.
Figure 14D:
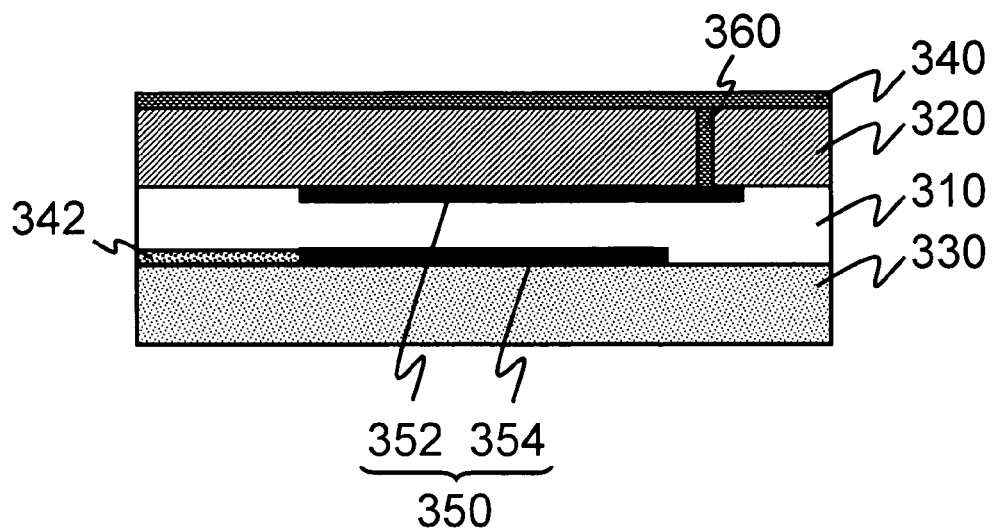
FIG. 14D is a sectional view of the multi-functional composite substrate structure according to the invention.

Besides, each of the metal plates 352, 354 can be electrically connected to the metal wire 342 on the same surface respectively for transmitting signals, as shown in FIG. 14C. Or, only one metal plate 354 is electrically connected to the metal wire 342 on the same surface, while the other metal plate 352 is electrically connected to the signal transmission circuit 340 on the second substrate 320 through the via 360 penetrating the substrate, as shown in FIG. 14D. The via 360 can be in the form of a wire, through hole, or blind hole. It can penetrate the substrate in a manner either perpendicular to the surface of the substrate or not perpendicular thereto.

Figure 15A:
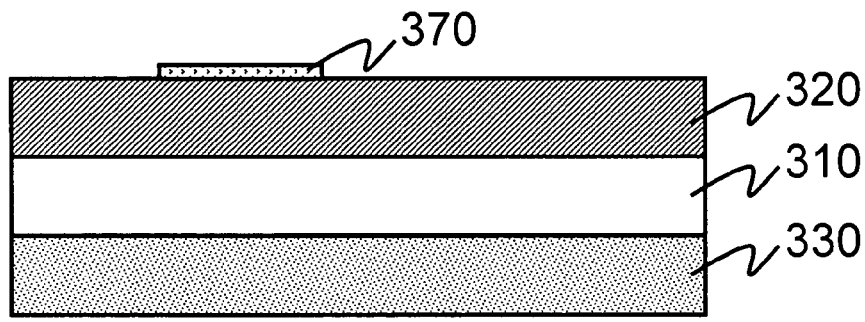
FIG. 15A is a sectional view of the multi-functional composite substrate structure according to the invention.
Figure 15B:
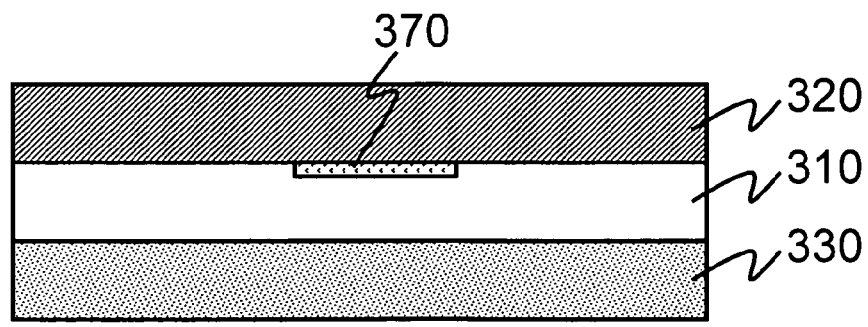
FIG. 15B is a sectional view of the multi-functional composite substrate structure according to the invention.
Figure 15C:
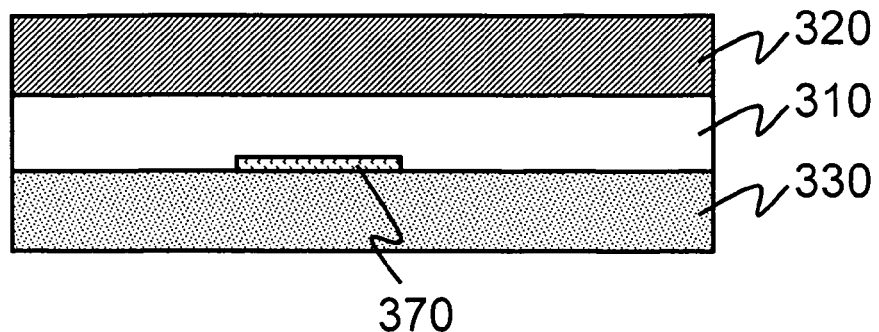
FIG. 15C is a sectional view of the multi-functional composite substrate structure according to the invention.
Figure 15D:
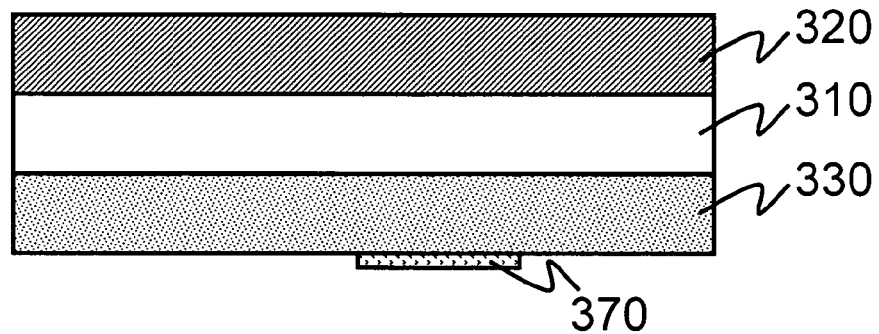
FIG. 15D is a sectional view of the multi-functional composite substrate structure according to the invention.
Figure 15E:
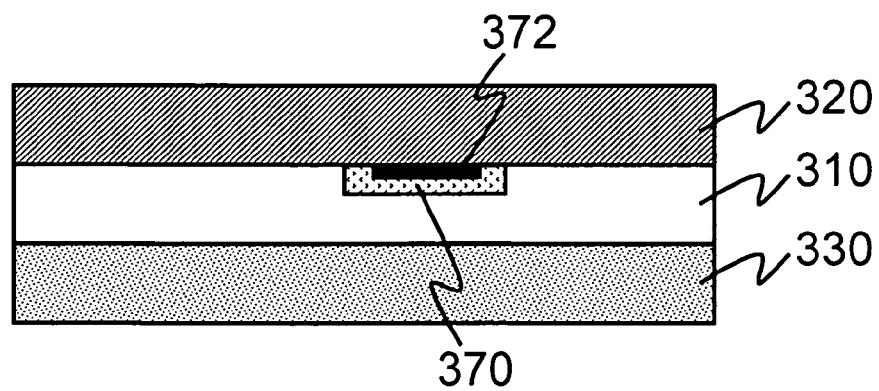
FIG. 15E is a sectional view of the multi-functional composite substrate structure according to the invention.
Figure 15F:
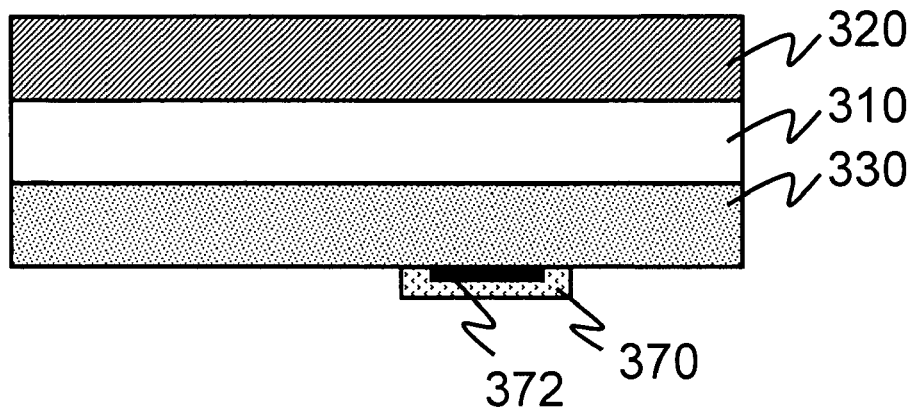
FIG. 15F is a sectional view of the multi-functional composite substrate structure according to the invention.
Figure 15G:
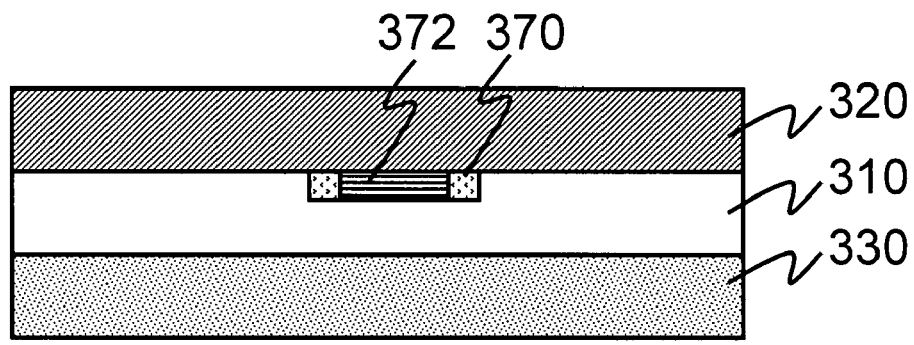
FIG. 15G is a sectional view of the multi-functional composite substrate structure according to the invention.

Moreover, magnetic materials can be coated on the surface of the second substrate 320 to form the permeance block 370 for fabricating an inductor, as shown in FIGS. 15A, 15B. As such, the inductor can be directly fabricated on the permeance block 370 to significantly increase its inductance. Further, materials of high permeance coefficient can be coated on the surface of the third substrate 330 to form the permeance block 370 for fabricating an inductor, as shown in FIGS. 15C, 15D. As such, the inductor 372 can be fabricated by winding wires or wiring on the second substrate 320 and then coating magnetic materials thereon on the permeance block 370, as shown in FIGS. 15E, 15F, and 15G. The inductor can be a spiral inductor, meander inductor, or solenoid inductor and so on. When the inductor 372 is a planar inductor (such as spiral inductor, or meander inductor), the shape of the inductive conductor loop formed by winding wires is similar to or equal to the shape of the permeance block.

The inductor between the layers, that is a built-in inductor, can also be electrically connected to the signal transmission circuit 340 on the second substrate 320 or the third substrate 330 through the via 360 penetrating the substrate, as shown in FIGS. 16A, 16B, 16C, and 16D. The via 360 can be in the form of a wire, through hole, or blind hole, and it can penetrate the substrate in a manner either perpendicular to the surface of the substrate or not perpendicular thereto.

Figure 16A:
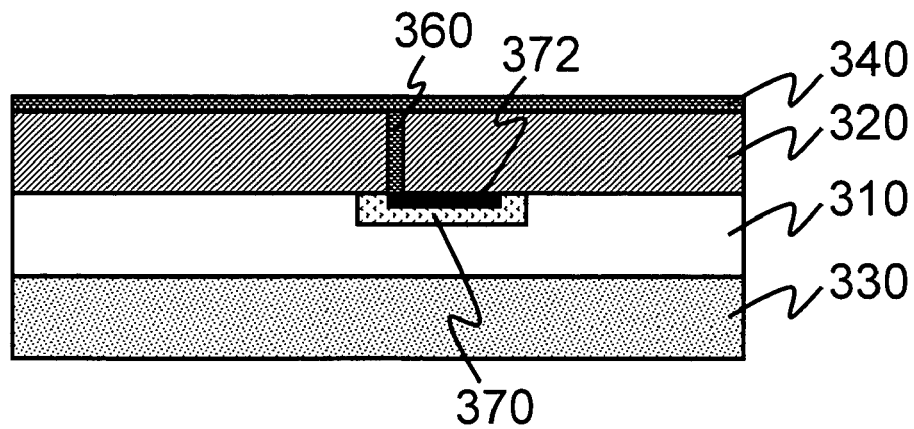
FIG. 16A is a sectional view of the multi-functional composite substrate structure according to the invention.
Figure 16B:
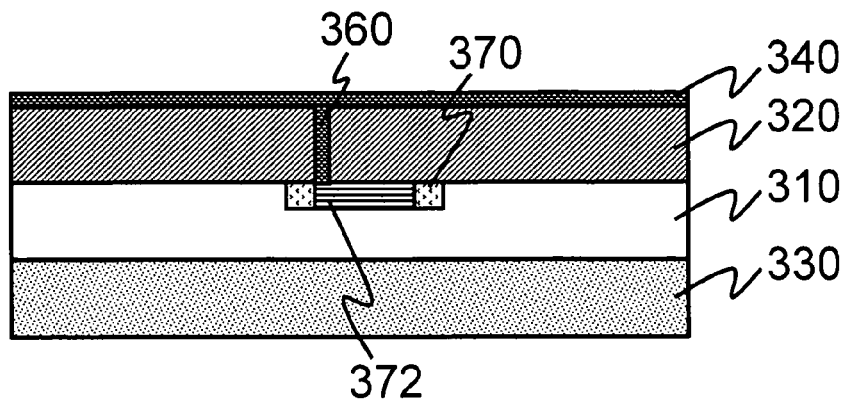
FIG. 16B is a sectional view of the multi-functional composite substrate structure according to the invention.
Figure 16C:
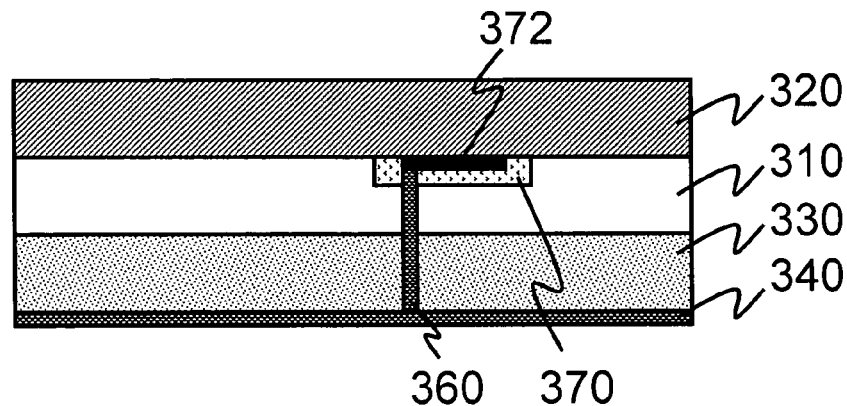
FIG. 16C is a sectional view of the multi-functional composite substrate structure according to the invention.
Figure 16D:
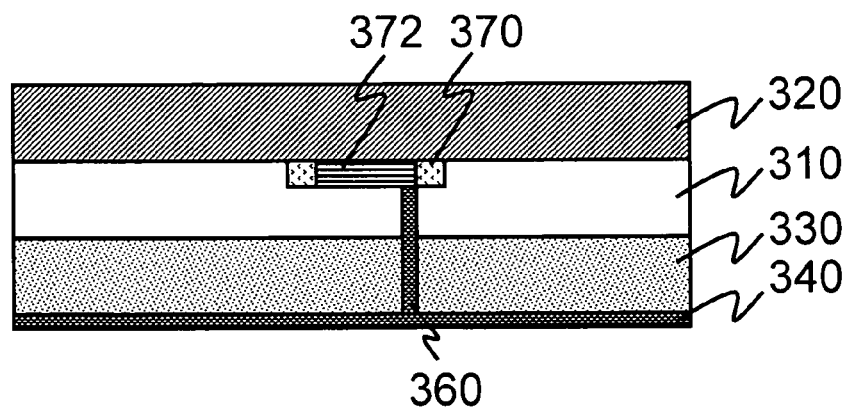
FIG. 16D is a sectional view of the multi-functional composite substrate structure according to the invention.
Figure 16E:
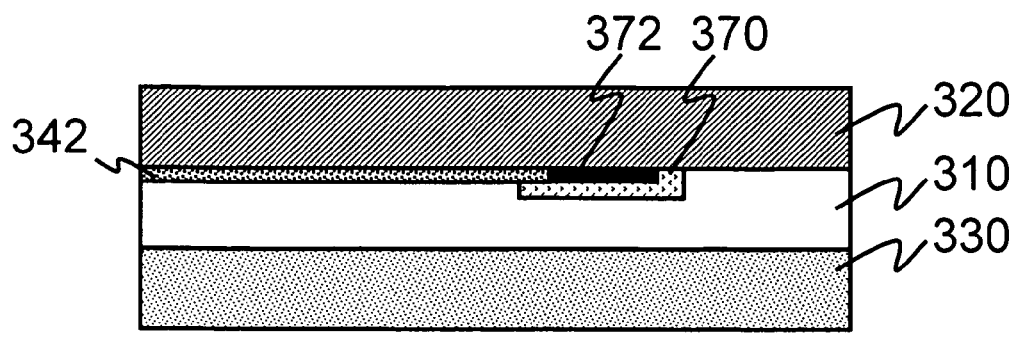
FIG. 16E is a sectional view of the multi-functional composite substrate structure according to the invention.
Figure 16F:
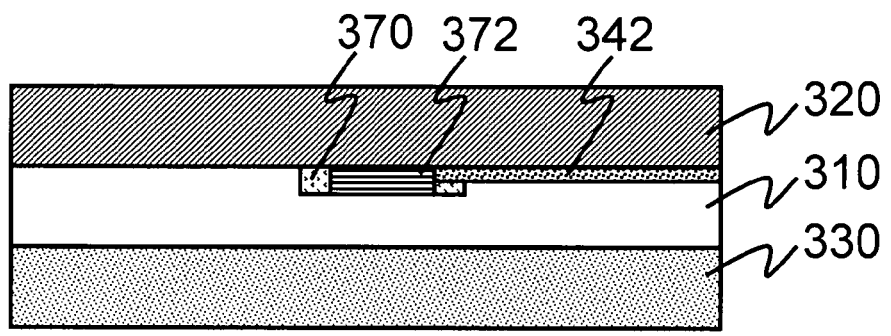
FIG. 16F is a sectional view of the multi-functional composite substrate structure according to the invention.
Figure 17A:
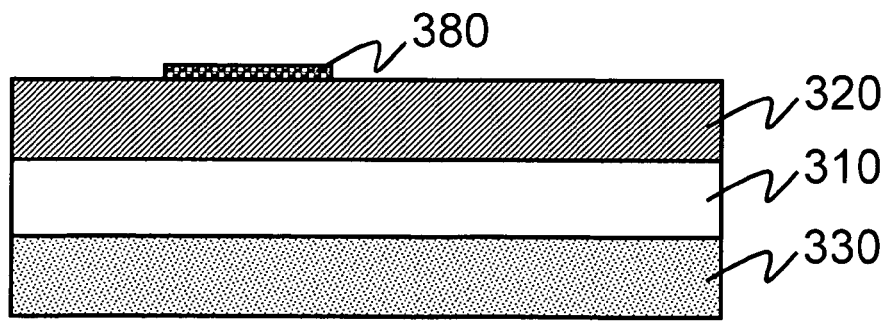
FIG. 17A is a sectional view of the multi-functional composite substrate structure according to the invention.
Figure 17B:
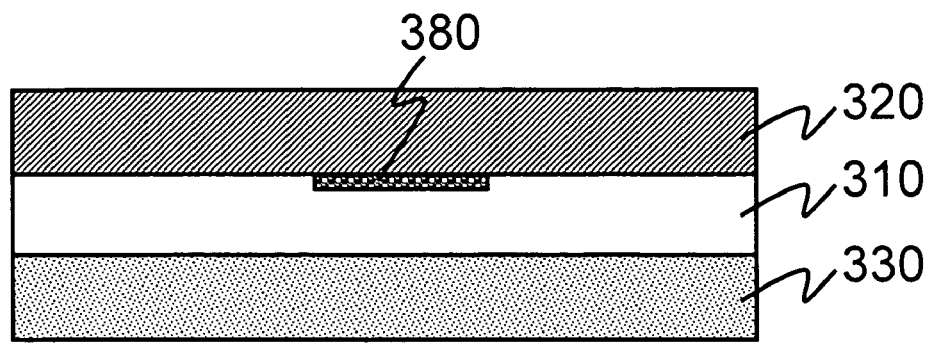
FIG. 17B is a sectional view of the multi-functional composite substrate structure according to the invention.
Figure 17C:
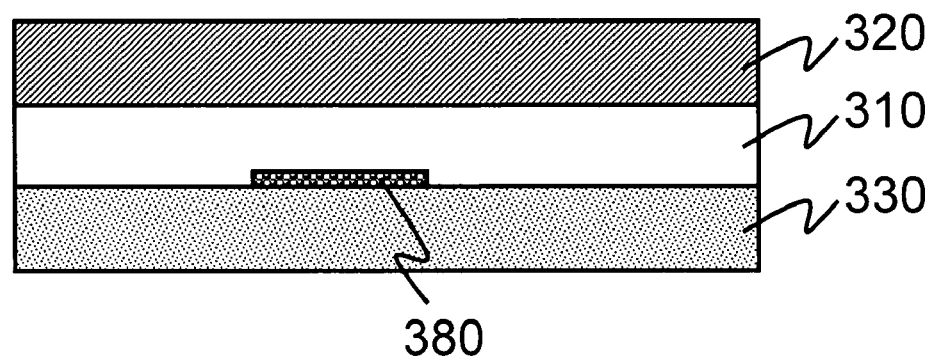
FIG. 17C is a sectional view of the multi-functional composite substrate structure according to the invention.
Figure 17D:
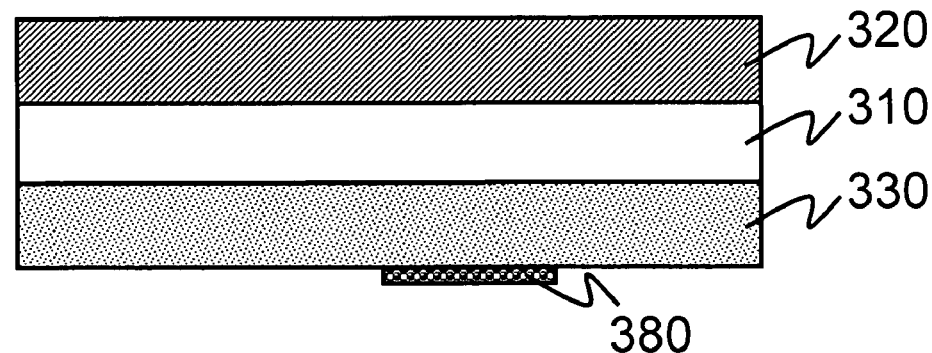
FIG. 17D is a sectional view of the multi-functional composite substrate structure according to the invention.

The inductor 372 can also be electrically connected to the metal wire 342 on the same surface for transmitting signals, as shown in FIGS. 16E and 16F.

Impedance materials can be coated on the surface of the second substrate 320/the third substrate 330 to form the resistor 380, so as to reduce the area of the resistor or build it inside, as shown in FIGS. 17A, 17B, 17C, and 17D.

Figure 18A:
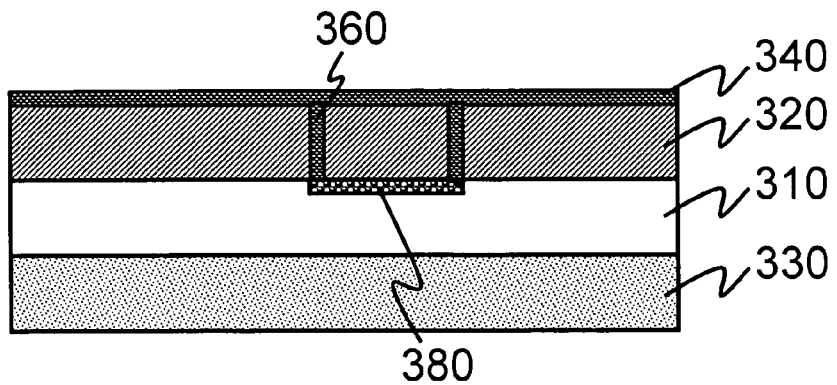
FIG. 18A is a sectional view of the multi-functional composite substrate structure according to the invention.
Figure 18B:
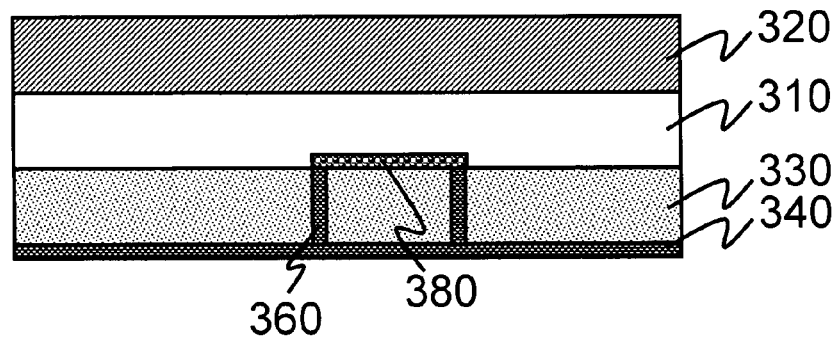
FIG. 18B is a sectional view of the multi-functional composite substrate structure according to the invention.
Figure 18C:
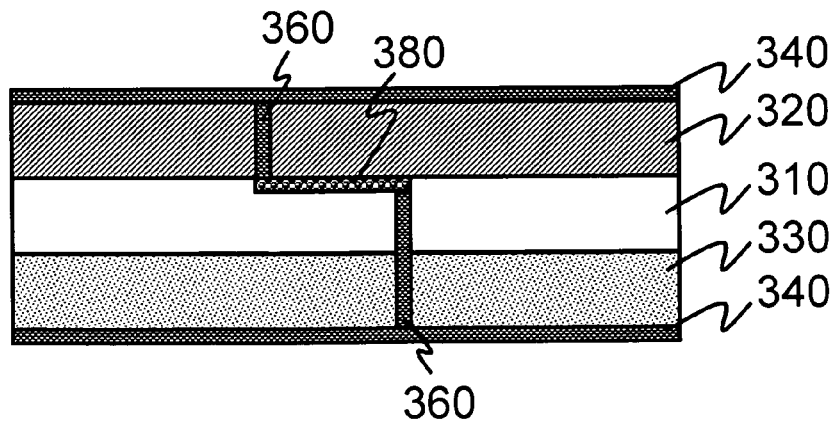
FIG. 18C is a sectional view of the multi-functional composite substrate structure according to the invention.

The resistor 380 between layers, that is a built-in resistor, can be electrically connected to the signal transmission circuit 340 on the second substrate 320/the third substrate 330 through the via 360 penetrating the substrate, as shown in FIGS. 18A, 18B, and 18C. The via 360 can be in the form of a wire, through hole, or blind hole, and it can penetrate the substrate in a manner either perpendicular to the surface of the substrate or not perpendicular thereto.

Figure 18D:
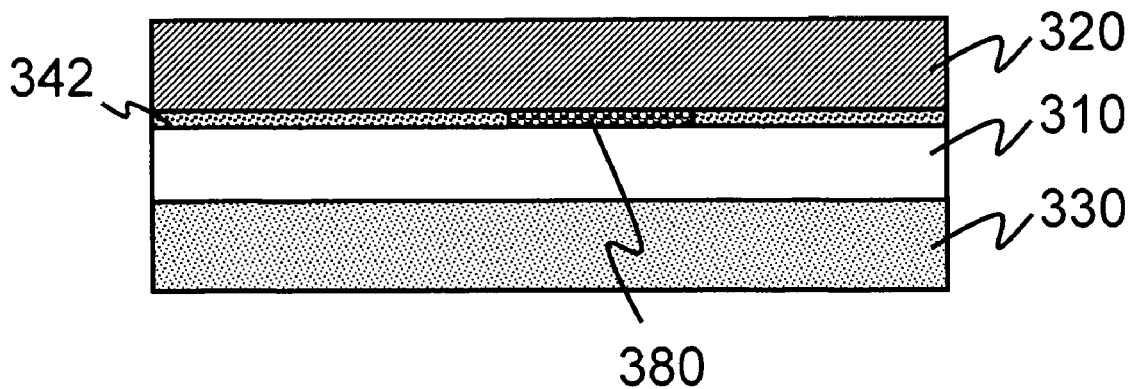
FIG. 18D is a sectional view of the multi-functional composite substrate structure according to the invention.
Figure 18E:
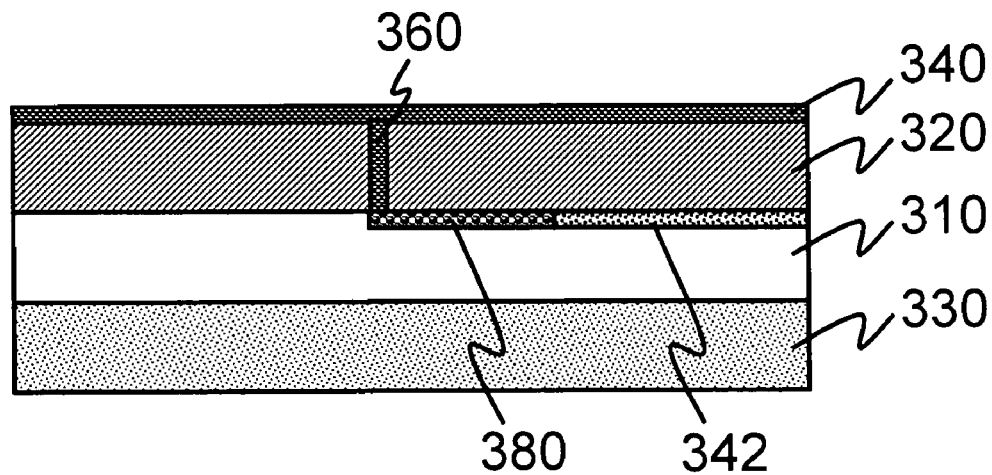
FIG. 18E is a sectional view of the multi-functional composite substrate structure according to the invention.

The resistor 380 can also be electrically connected to the metal wire 342 on the same surface respectively for transmitting signals, as shown in FIG. 18D. Or, one end of the resistor 380 is electrically connected to the metal wire 342 on the same surface, while the other end of the resistor 380 is electrically connected to the signal transmission circuit 340 on the second substrate 320 through the via 360 penetrating the substrate, as shown in FIG. 18E. The via 360 can be in the form of a wire, through hole, or blind hole, and it can penetrate the substrate in a manner either perpendicular to the surface of the substrate or not perpendicular thereto.

Moreover, when the first substrate 310 is made of materials of low dielectric loss, components such as the signal transmission circuit 340, inductor 372, and resistor 380 can also be disposed on the first substrate by the above manner.

Seen from the above, though only one or two kinds of components are fabricated in the multi-functional composite substrate structure provided by the present invention, in fact, the multi-functional composite substrate structure of the invention can have at least one of the passive components (such as resistors 380, capacitors 350, and inductors 372) and the signal transmission circuit 340. Moreover, each component can be singular or in multiple. That is to say, according to the random combination of the above structures, the formed multi-functional composite substrate structure of the present invention can have at least one of the passive components (such as resistors 380, capacitors 350, and inductors 372) and the signal transmission circuit 340, wherein each component can be singular or in multiple.

Though only the substrate structure of the passive components such as built-in resistors, capacitors, and inductors are illustrated, in fact, likewise, according to the multi-functional composite substrate structure of the present invention, many microwave functional devices (such as filters, balanced/unbalanced converters, couplers, and antennas) can be built inside the substrate structure, for reducing the area of the whole substrate, thereby saving many materials and reducing the assembly cost.

Figure 19:
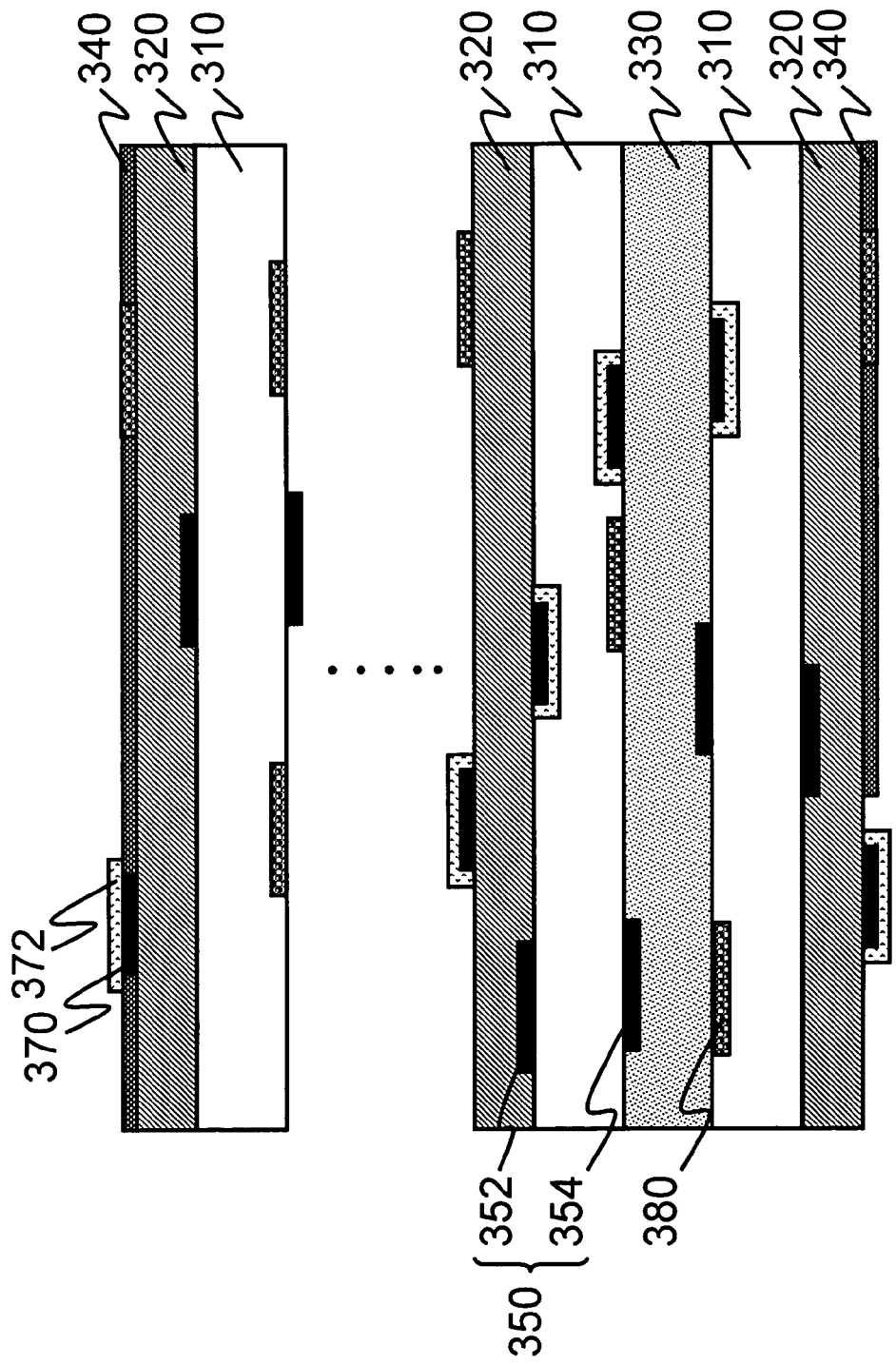
FIG. 19 is a sectional view of the multi-functional composite substrate structure according to the invention.

Further, only a two-layer and a three-layer multi-functional composite substrate structures are illustrated here, in fact, according to the present invention, the foregoing embodiments can be optionally combined to provide a four-layer or above four-layer multi-functional composite substrate structure. For example, referring to FIG. 19, multiple first substrates 310 and multiple second substrates 320 are interlaced on both surfaces of the third substrate 330 in the sequence of the first substrate 310 and the second substrate 320. The third substrate 330 can be an ordinary PCB (such as FR4 substrate, FR5 substrate, ceramic substrate, or film substrate). The dielectric constant of the first substrate 310 is higher than that of the third substrate 330. The built-in capacitor 350 can be formed by respectively disposing two coupled metal plates 352, 354 on both surfaces of the first substrate 310. Further, magnetic materials can be coated on the surface of the second substrate 320/the third substrate 330 to form the permeance block 370 for fabricating an inductor thereon. The resistor 380 can be formed by coating impedance materials on the surface of the second substrate 320/the third substrate 330. The signal transmission circuit 340 can be disposed at the outside layer, i.e., the upper and lower surfaces of the whole multi-functional composite substrate structure, so as to avoid interference and impedance mismatch caused by signal delay and structural discontinuity of the signal transmission circuit 340 can be avoided, such as a signal transmission circuit 340 through a via or non-system impedance.

Figure 20:
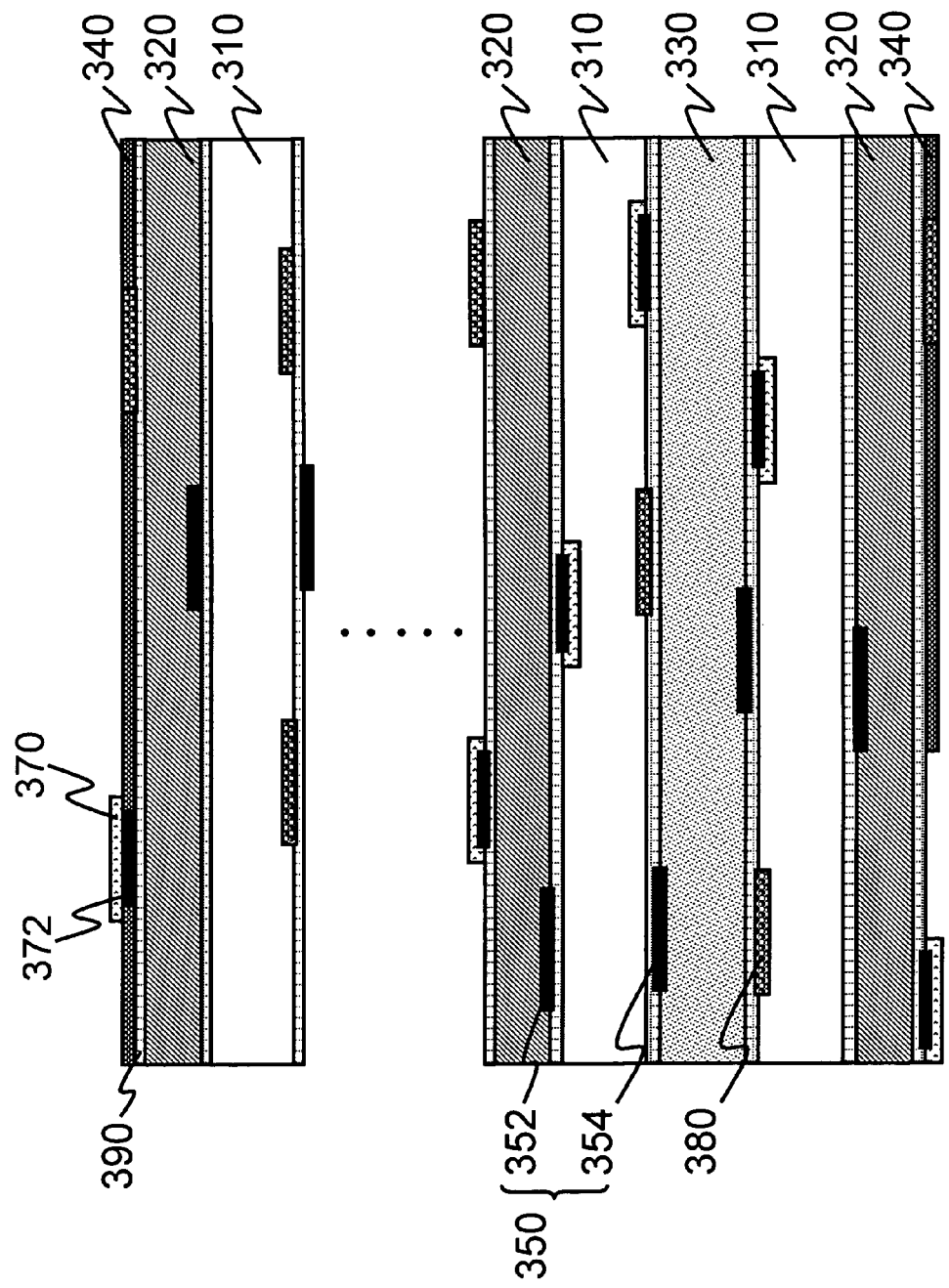
FIG. 20 is a sectional view of the multi-functional composite substrate structure according to the invention.

The substrates can be jointed by lamination. That is to say, after the previous work (such as fabricating the built-in capacitors and coating the magnetic materials/impedance materials) is finished, the substrates are laminated sequentially according to the present invention. To achieve a successful lamination or improve thermal and stress aspects, a small amount of auxiliary material 390 (such as a material different from the material of the substrates, being metal or nonmetal) can be applied to (additionally coated or laminated on) the surface of the substrates beforehand, so as to help bind the metal and the substrate together or enhance the thermal and stress properties of the substrate, as shown in FIG. 20.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A multi-functional composite substrate structure, comprising:
    a first substrate, the first substrate having a top surface and a bottom surface;
    a second substrate, disposed on the top surface of the first substrate;
    a third substrate, disposed on the bottom surface of the first substrate, the dielectric constant of the third substrate lower than the dielectric constant of the first substrate; the dielectric constant of the third substrate higher than the dielectric constant of the second substrate, the dielectric loss of the third substrate higher than the dielectric constant of the second substrate; and
    two signal transmission circuits, the signal transmission circuits disposed on a side of the second substrate opposite to the first substrate and a side of the third substrate opposite to the first substrate, respectively, each of the signal transmission circuits having a specific system impedance and the system impedances of the signal transmission circuits being different from each other.

2. The multi-functional composite substrate structure according to claim 1, wherein the signal transmission circuit is disposed on at least one of the sides opposite to the side of said second substrate adjacent to the first substrate or opposite to the side of the third substrate adjacent to the first substrate.

3. The multi-functional composite substrate structure according to claim 1, further comprising:
    at least one auxiliary material, disposed on the surface of at least one of the first substrate, the second substrate, and the third substrate.

4. The multi-functional composite substrate structure according to claim 3, further comprising:
    at least one inductor, disposed on the permeance block.

5. The multi-functional composite substrate structure according to claim 4, further comprising:
    at least one via, electrically connecting the inductor and the signal transmission circuit.

6. The multi-functional composite substrate structure according to claim 1, further comprising:
    at least one capacitor, disposed on the first substrate.

7. The multi-functional composite substrate structure according to claim 6, further comprising:
    at least one via, electrically connecting the capacitor and the signal transmission circuit.

8. The multi-functional composite substrate structure according to claim 1, further comprising:
    at least one resistor, wherein each resistor is disposed on the surface of one of the second substrate, and the third substrate.

9. The multi-functional composite substrate structure according to claim 8, further comprising:
    at least one via, electrically connected to the resistor and the signal transmission circuit.

10. The multi-functional composite substrate structure according to claim 1, further comprising:
    at least one auxiliary material, disposed on the surface of at least one of the first substrate, the second substrate, and the third substrate.

11. The multi-functional composite substrate structure according to claim 1, further comprising:
   at least one permeance block, wherein each permeance block is disposed on the surface of one of the second substrate and the third substrate.

12. The multi-functional composite substrate structure according to claim 11, further comprising:
   at least one inductor, disposed on the permeance block.

13. The multi-functional composite substrate structure according to claim 12, further comprising:
   at least one metal wire, electrically connected to the inductor respectively, wherein the electrically connected metal wire and the inductor are disposed on the same surface of the same substrate.

14. The multi-functional composite substrate structure according to claim 12, further comprising:
   at least one auxiliary material, disposed on the surface of at least one of the first substrate, the second substrate, and the third substrate.

15. The multi-functional composite substrate structure according to claim 1, further comprising:
   at least one capacitor, disposed on the first substrate.

16. The multi-functional composite substrate structure according to claim 15, further comprising:
   at least one metal wire, electrically connected to the capacitor respectively, wherein the electrically connected metal wire and the capacitor are disposed on the same surface of the first substrate.

17. The multi-functional composite substrate structure according to claim 15, further comprising:
   at least one auxiliary material, disposed on the surface of at least one of the first substrate, the second substrate, and the third substrate.

18. The multi-functional composite substrate structure according to claim 1, further comprising:
   at least one resistor, wherein each resistor is disposed on the surface of one of the second substrate and the third substrate.

19. The multi-functional composite substrate structure according to claim 18, further comprising:
   at least one metal wire, electrically connected to the resistor respectively, wherein the electrically connected metal wire and the resistor are disposed on the same surface of the same substrate.

20. The multi-functional composite substrate structure according to claim 18, further comprising:
   at least one auxiliary block, disposed on the surface of at least one of the first substrate, the second substrate, and the third substrate.

21. The multi-functional composite substrate structure according to claim 1, further comprising:
   at least one auxiliary material, disposed on the surface of at least one of the first substrate, the second substrate, and the third substrate.

* * * * *